(12) United States Patent
Bean

(10) Patent No.: US 9,434,308 B2
(45) Date of Patent: Sep. 6, 2016

(54) SYSTEM FOR DETECTING THE INTEGRITY OF A LIGHTING CIRCUIT

(71) Applicant: R.A. PHILLIPS INDUSTRIES, INC., Santa Fe Springs, CA (US)

(72) Inventor: Adam Bean, Hacienda Heights, CA (US)

(73) Assignee: R.A. PHILLIPS INDUSTRIES, INC., Santa Fe Springs, CA (US)

( * ) Notice: Subject to any disclaimer, the term of this patent is extended or adjusted under 35 U.S.C. 154(b) by 1 day.

(21) Appl. No.: 14/542,214

(22) Filed: Nov. 14, 2014

(65) Prior Publication Data

US 2015/0137961 A1    May 21, 2015

Related U.S. Application Data

(60) Provisional application No. 61/905,082, filed on Nov. 15, 2013.

(51) Int. Cl.

| | |
|---|---|
| *G08B 21/00* | (2006.01) |
| *B60Q 11/00* | (2006.01) |
| *G01R 31/00* | (2006.01) |
| *G01R 31/04* | (2006.01) |
| *G01R 31/44* | (2006.01) |
| *G01R 19/165* | (2006.01) |

(52) U.S. Cl.
CPC ........... *B60Q 11/005* (2013.01); *G01R 31/007* (2013.01); *G01R 31/045* (2013.01); *G01R 19/165* (2013.01); *G01R 31/44* (2013.01)

(58) Field of Classification Search
CPC  B60Q 11/005; G01R 31/041; G01R 31/007; G01R 31/045; G01R 31/44; G01R 19/156; G08B 21/00

USPC ........... 340/431, 533, 438, 425.5, 641, 642, 340/664, 662, 663, 660, 435, 456, 458, 463, 340/468; 701/34; 324/504, 503; 307/10.1, 307/10.8; 342/70; 180/167, 271
See application file for complete search history.

(56) References Cited

U.S. PATENT DOCUMENTS

| | | | |
|---|---|---|---|
| 5,739,592 A | 4/1998 | Rigsby et al. | |
| 6,127,939 A * | 10/2000 | Lesesky | B60R 16/0315 303/122 |
| 6,218,952 B1 | 4/2001 | Borland et al. | |
| 6,525,654 B1 * | 2/2003 | Siggers | G01R 31/006 340/425.5 |
| 6,864,782 B1 * | 3/2005 | Aaron | B60Q 9/006 340/431 |
| 2006/0267746 A1 * | 11/2006 | Kinsey | B60Q 11/00 340/431 |
| 2007/0241868 A1 * | 10/2007 | Fackrell | B60T 7/042 340/431 |

\* cited by examiner

*Primary Examiner* — Anh V La
(74) *Attorney, Agent, or Firm* — Lewis Roca Rothgerber Christie LLP

(57) ABSTRACT

A status monitoring circuit for monitoring the status of an external device coupled to an electrical system of a vehicle, the status monitoring device including a sensing unit coupled to the external device and configured to sense an input voltage and an input current at the external device, a monitoring unit coupled to the sensing unit and configured to determine a normal operation of the external device based on the sensed input voltage, and, in response, to detect an undercurrent condition of the external device based on the sensed input current, and a status indicator coupled to the monitoring unit and configured to display a fault indication in response to the monitoring unit detecting the undercurrent condition.

20 laims, 4 Drawing Sheets

SYSTEM FOR DETECTING THE INTEGRITY OF A LIGHTING CIRCUIT

CROSS-REFERENCE TO RELATED APPLICATION(S)

This patent application claims priority to and the benefit of U.S. Provisional Application Ser. No. 61/905,082, filed Nov. 15, 2013, titled "System for Detecting the Integrity of a Lighting Circuit," the entire content of which is incorporated herein by reference.

BACKGROUND

1. Field

Embodiments of the present invention relate to lighting systems for trucks, trailers, and other motor vehicles.

2. Related Art

Trailers that are hitched to, and towed behind, tractors, trucks, or other vehicles have lighting systems that typically include stop lights, turn signals, brake lights, exterior lights, interior lights, or other electrical devices. These devices are often operated using controls at the interior of the vehicle towing the trailer. This may be accomplished electrically by coupling one or more electrical wires from the trailer to corresponding wires of the vehicle used to tow the trailer (e.g., via a plug and socket, such as a 7-way connector). Accordingly, by operating controls of the vehicle (e.g., a brake pedal, a turn signal switch, or another type of switch), a signal may be sent via one or more of the wires of the vehicle through the electrical coupling, and to the corresponding wire(s) of the trailer, thereby enabling the vehicle operator to effectively control circuits or devices of the trailer.

A persistent problem affecting the trucking/tractor trailer industry is the corrosion of electrical wires, electrical connections, or electrical junctions used in circuits of trucks and trailers. Corrosion may be caused by, for example, salt and de-icing agents, which are used on the roads on which the tractors and trailers travel, as well as moisture or water present on the roads and in the atmosphere. When these materials reach exposed electrical wiring or electrical connections, the materials can chemically react with the metals of the wires and connections to create rust or corrosion. Such rust and corrosion can lead to power being inconsistently or inefficiently transmitted to the lights, turn indicators, brake signals, etc., and can even lead to a total loss of power to these circuits.

Inconsistent power transmission through the electrical circuits due to bad electrical connections or due to corrosion can cause, for example, a trailer's exterior lighting system to flicker or to fail to turn on. The rust or corrosion may create a barrier at a surface of the electrical wires, or may cause the surface area of the electrical wires or the corresponding connection to be corroded away, thereby causing poor contact due to wires/pins failing to make surface contact with each other.

A driver/operator of a tractor towing a trailer may not be aware of deterioration of the truck or trailer electrical systems because the driver does not have a direct line-of-sight to many of the trailer's lighting systems from the cab of the tractor. This can create safety hazards due to inconsistent or non-existent power transmission to components of the trailer. Additionally, the driver of the truck may potentially receive a traffic citation for improperly working equipment.

Currently used lighting/electrical signal testers may be plugged into a cord located at the back of a tractor to test various electrical circuits. For example, a tester may be plugged into a 7-way connector coupled to the tractor's electrical system. The operator can then switch ON the trailer's lights, for example, and the light tester will indicate whether or not there is a voltage at one or more pins of the electrical connector. However, commonly used circuit testers cannot be used when a tractor-trailer is in motion, as they require that the electrical system of the tractor be disconnected from the electrical system of the trailer. This is due to the hardwiring of the electrical system, which is constantly actively running.

SUMMARY

Accordingly, to provide better monitoring of the various electrical systems of a trailer, embodiments of the present invention monitor the various electrical connections to the trailer's electrical systems, such as the trailer's lighting systems, in real time. Embodiments of the invention may be built into the circuitry of the electrical systems. Furthermore, embodiments of the invention may notify the operator of the tractor when inconsistent power transmission to the trailer's electrical system occurs (e.g., due to a faulty connection with the electrical systems of the tractor via the electrical wires), including at times when the vehicle is in motion.

According to embodiments of the present invention, there is provided a status monitoring circuit for monitoring the status of an external device coupled to an electrical system of a vehicle, the status monitoring device including: a sensing unit coupled to the external device and configured to sense an input voltage and an input current at the external device; a monitoring unit coupled to the sensing unit and configured to determine a normal operation of the external device based on the sensed input voltage, and, in response, to detect an undercurrent condition of the external device based on the sensed input current; and a status indicator coupled to the monitoring unit and configured to display a fault indication in response to the monitoring unit detecting the undercurrent condition.

In some embodiments, the monitoring unit is further configured to determine the normal operation of the external device when the sensed input voltage exceeds a voltage threshold.

In some embodiments, the monitoring unit is further configured to detect the undercurrent condition of the external device when the sensed input current is less than a current threshold.

In some embodiments, the sensing unit includes a resettable fuse configured to shut off current to the external device when the input current exceeds an overcurrent threshold.

In some embodiments, the resettable fuse includes a polymeric positive temperature coefficient device.

In some embodiments, the sensing unit includes: a voltage divider configured to generate an attenuated input voltage proportional to the input voltage and to transmit the attenuated input voltage to monitoring unit.

In some embodiments, the monitoring unit is further configured to determine the normal operation of the external device when the attenuated input voltage exceeds a voltage threshold.

In some embodiments, the voltage threshold is substantially zero.

In some embodiments, the sensing unit includes: a sense resistor in line with the input current; a differential amplifier for generating an output voltage proportional to the input current traversing the sense resistor; and a voltage divider for attenuating the output voltage and to transmit, to the monitoring unit, a signal indicative of the input current.

In some embodiments, the monitoring unit is further configured to detect the undercurrent condition of the external device when the transmitted signal is less than a current threshold.

In some embodiments, the sensing unit includes a non-contact type current sensor.

In some embodiments, the status monitoring circuit further includes a power unit configured to supply a regulated voltage to the monitoring unit and the status indicator, wherein the power unit regulates the input voltage at the external device to generate the regulated voltage.

In some embodiments, the power unit includes a linear regulator or a switching regulator.

In some embodiments, the monitoring unit includes a programmable microcontroller configured not to detect the undercurrent condition when the vehicle is in engine start mode.

In some embodiments, the status indicator includes: an indicator light; and a switch configured to turn ON the indicator light in response to the monitoring unit detecting the undercurrent condition.

According to embodiments of the present invention, there is provided a status monitoring connector configured to be coupled to an electrical system of a tractor and an electrical system of trailer including an external device, the status monitoring connector including: a sensing unit coupled to the external device and configured to sense an input voltage and an input current at the external device; a monitoring unit coupled to the sensing unit and configured to determine a normal operation of the external device based on the sensed voltage, and, in response, to detect an undercurrent condition of the external device based on the sensed input current; a status indicator coupled to the monitoring unit and configured to display a fault indication in response to the monitoring unit detecting the undercurrent condition; a housing configured to accommodate the sensing unit and the monitoring unit; a first end coupled to the housing and configured to couple to the electrical system of the tractor; and a second end coupled to the housing and configured to couple to the electrical system of the trailer.

In some embodiments, the first and second ends are compatible with a multi-conductor plug and socket arrangements of the electrical systems of the tractor and the trailer.

In some embodiments, the first end includes a female connector and the second end includes a male connector, the female and male connectors being configured to physically mate and electrically couple to one another.

In some embodiments, the first end and the second end are configured not to physically mate with one another.

BRIEF DESCRIPTION OF THE DRAWINGS

The accompanying drawings, together with the specification, illustrate exemplary embodiments of the present invention, and, together with the description, serve to explain aspects of embodiments of the present invention. The above and other features and aspects of the present invention will become more apparent by the following detailed description of exemplary embodiments thereof with reference to the attached drawings, in which.

DETAILED DESCRIPTION

Figure 1:
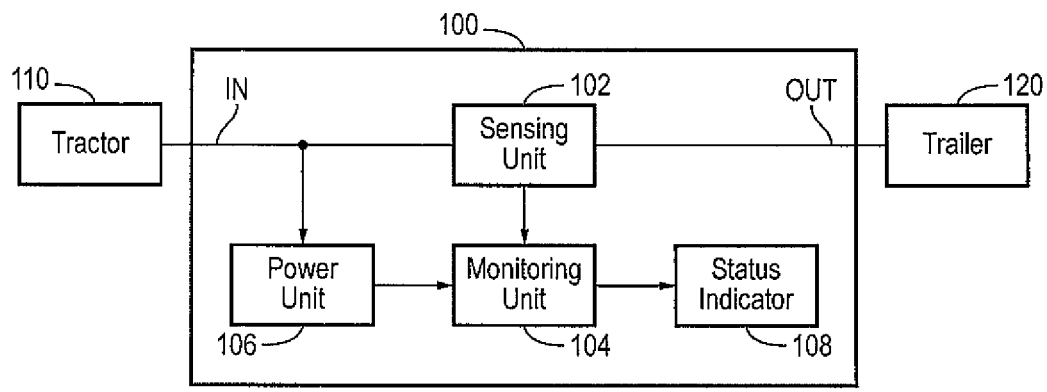
FIG. 1 is a schematic diagram of a status monitoring device for monitoring the status of devices external to a tractor, according to some embodiments of the present invention.

Hereinafter, embodiments of the present invention will be described more fully with reference to the accompanying drawings, in which, exemplary embodiments of the present invention are shown. As those skilled in the art would realize, the described embodiments are susceptible to various modifications and alternative forms without departing from the spirit or scope of the present invention. For clarity of the description of the present invention, some elements or features not required for the complete understanding of the present invention may be omitted.

Like reference numerals in the drawings denote like elements, and repeated descriptions thereof may be omitted.

An external device, such as a light, that is electrically connected to the electrical system of a trailer may typically draw an expected level of current during normal operation. The status monitoring device of the present embodiment continually measures the level of current through, or the voltage of, each external device of the trailer electrical system. That is, the device of the present embodiment may monitor the various external devices in real time, although status monitoring devices of other embodiments of the present invention may periodically, discontinuously, or intermittently monitor the various circuits, or may monitor the various circuits upon receiving a user-initiated command. Accordingly, when there is an intermittent change in the continuity of the external device, which may, for example, cause a light flicker, the status monitoring device may detect a change in current or voltage of the external device, which may indicate a faulty or failing electrical connection.

The electrical connection (e.g., cable or harness) between the electrical circuits of a tractor and trailer of a vehicle include a number of conductors that provide power to the external devices of the trailer. By monitoring said conductors, the status indicating device of the present invention may determine if there is a loss in power delivered through any one of the conductors, or if power is being inconsistently or improperly delivered through any one of the conductors, and may thereafter display one or more fault indicators to the person operating the truck or tractor using a display, thus alerting the operator of a potential electrical issue.

Due to Federal Motor Carrier Safety Administration (FMCSA) regulations, operators of tractors and tractor trailers may be targeted by law enforcement for having lights, such as a trailer's exterior lights, that flicker due to intermittent electrical contact within the electrical system. By alerting the operator of an electrical contact or other issue by display of an error code, the device of the present embodiment gives the operator an opportunity to inspect and address the problem causing the issue, thereby potentially avoiding a traffic citation for violating FMCSA regulations.

FIG. 1 is a schematic diagram of a status monitoring device 100 for monitoring the status of devices external to a tractor 110, according to some embodiments of the present invention.

In some embodiments, the status monitoring device 100 is coupled (e.g., electrically connected) between the electrical system of a tractor 110 and the electrical system of a trailer 120. As the electrical power flows from the tractor 110 (e.g., from the tractor battery or generator) to the trailer 120, the status monitoring device 100 may be coupled in series with the electrical system of the trailer 120 (e.g., be in-line with or in a current path from the tractor 110 to the trailer 120). The electrical system of the trailer 120 may include a plurality of auxiliary devices, such as stop lights, turn signals, brake lights, exterior lights, interior lights, an anti-lock braking system (ABS) and/or other electrical devices external to the tractor 110, which may be attached to or provided in the trailer 120.

According to some embodiments, the status monitoring device 100 includes a sensing unit 102, a monitoring unit 104, a power unit 106, and a status indicator 108. The sensing unit 102 senses (e.g., continuously senses) the current and voltage at the output of tractor's electrical system (or at the input of the trailer's electrical system). The monitoring unit 104 monitors the sensed current and the sensed voltage of the line to detect any faults that may occur in the trailer electrical system (e.g., one or more of the trailer's external devices). The power unit 106 supplies regulated power to the components of the status monitoring device 100, such as the monitoring unit 104 and the status indicator 108. In some embodiments, the power unit 106 may draw power from the tractor (e.g., through the input line IN), however, in other embodiments, the power unit 106 may draw upon a local power source such as a battery. The status indicator 108 displays the status of the trailer electrical circuit (e.g., the status of one or more of the external devices) according to one or more signals from the monitoring unit 104. For example, the status indicator 108 may warn an operator (e.g., driver) of the vehicle that a light, such as a signal or brake light, has failed and may need replacement.

Generally, the electrical connection between the tractor 110 and the trailer 120 may be facilitated through a plurality of conductors. Each conductor, which has a particular color designation, may provide power to a different external device (e.g., light) in the trailer electrical system. As an example, the following table provides the color indications of some of said conductors, and the corresponding circuit to which they provide power:

| | |
|---|---|
| Red | Brake/stop lights |
| Black | License plate lighting |
| Brown | Marker lights |
| Blue | Auxiliary circuits (e.g., lift gates) |
| Green | Left turn signal marker |
| yellow | Right turn signal marker |

Further, a ground conductor (GND) may couple the reference voltages of the trailer and tractor electrical systems together. According to embodiments of the present invention, the sensing unit 102 senses (e.g., continuously senses) the voltage at, and the current through, one or more of said conductors, and communicates the sensed voltages and currents to the monitoring unit 104.

Figure 2:
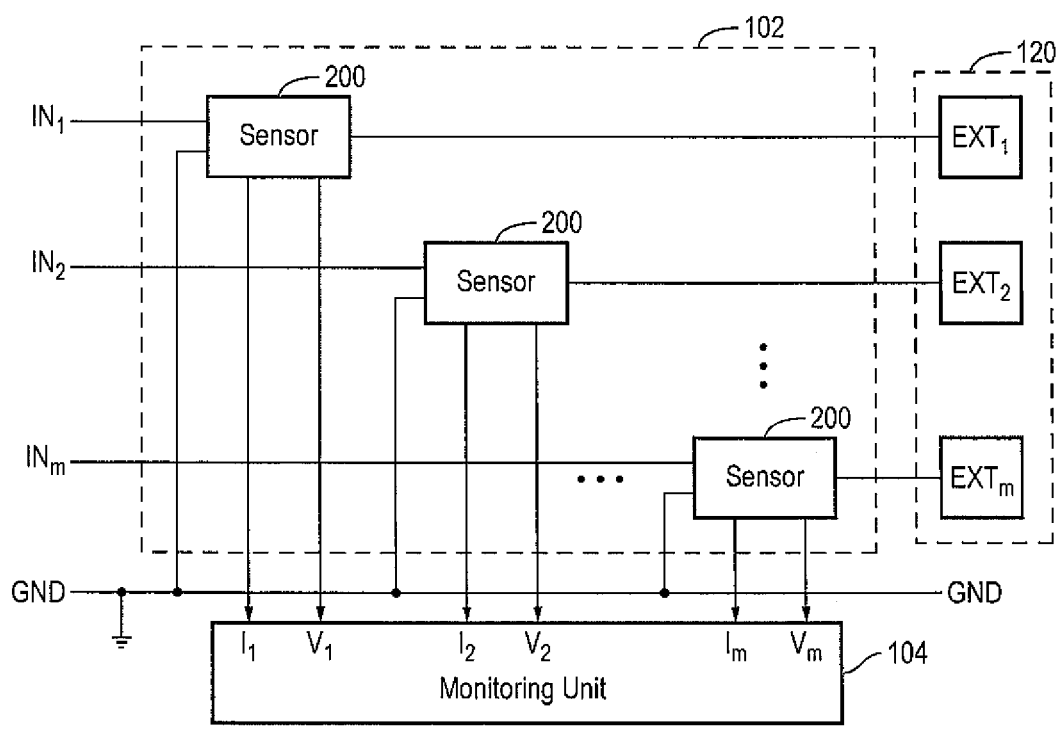
FIG. 2 is a schematic, diagram of the sensing unit of the status monitoring device coupled to the external devices of a trailer electrical system, according to some embodiments of the present invention.

FIG. 2 is a schematic diagram of the sensing unit 102 of the status monitoring device 100 coupled to the external devices EXT of a trailer electrical system, according to some embodiments of the present invention.

In some embodiments, the sensing unit 102 includes m (m being an integer greater than zero) sensors 200, each sensor 200 corresponding to a different one of the one or more external devices (e.g., $EXT_1$ to $EXT_m$) and configured to measure the input voltage and the input current of the corresponding external device. The sensors 200 communicate (e.g., transmit) the measured one or more input voltages (e.g., $V_1$, $V_2$ ... or, $V_m$) and input currents (e.g., $I_1$, $I_2$ ... or, $I_m$) to the monitoring unit 104 for processing.

The monitoring unit 104, which may be a programmable micro-processor (e.g., a microcontroller), may then use the one or more input voltages and currents to determine whether a fault has occurred in any of the external devices EXT being monitored. When an external device (e.g., a signal or brake light) is ON (e.g., is powered an operational), a drop in the current drawn by that external device EXT may indicate a failure within the external device EXT (e.g., a broken light). In some embodiments, the monitor unit 104 is programmed with one or more threshold currents corresponding to the operation currents of the one or more monitored external devices (e.g., $EXT_1$ to $EXT_m$). When a sensed current falls below a corresponding threshold for a period of time (e.g., a corresponding predetermined period of time), the monitoring unit 104 determines that fault has occurred in the corresponding external device EXT.

According to some embodiments of the present invention, the monitoring unit 104 determines (and programs) the threshold value for each of the external devices based on a baseline current draw of each of the external devices EXT. The baseline value may be the current drawn by an external device EXT at its initial power on. Over time, the base line value may represent the average (e.g., running average) of the current draw by the external device EXT during the time period that said device is powered ON. For each external device, the monitoring device 104 may set the threshold current at a suitable value below the corresponding baseline value. For example, if the baseline current draw of an external device (such as a brake light) is 1.5 A, the threshold may be set at 1.3 A. In determining (e.g., calculating) the baselines value(s), the monitoring unit 104 may ignore all current readings occurring while an external device EXT is faulty. However, embodiments of the present invention are not limited thereto, and the threshold currents may be pre-programmed (e.g., manually programmed by a user) to suitable values depending on the operational characteristics (e.g., normal operating current) of the corresponding external device EXT. In some examples, the programmed threshold currents may be substantially the same.

In some embodiments, the monitoring unit 104 determines that a monitored external device EXT is ON (e.g., is powered an operational) by monitoring the corresponding sensed input voltage (e.g., $V_1$, $V_2$ ... or, $V_m$). For example, if a sensed voltage is below a voltage threshold (e.g., substantially zero), the monitoring unit 104 may determine that the corresponding external device EXT is OFF (e.g., not operational), and disregard the corresponding sensed input current. The voltage threshold may be set to a suitable value below the power ON voltage (e.g., about half of the maximum sensed input voltage). For example, the voltage threshold may be set to about 2.5-3 V for an embodiment in which the monitoring unit 104 is powered by a supply voltage of about 5 V.

In some embodiments, the monitoring unit 104 is configured to take into account power interruptions that may occur during engine start or result from alternator noise and cranking, and disregard low current readings during these events. For example, at engine start, the voltage supplied by the tractor electrical system (e.g., tractor battery), may temporarily drop from about 12.8 V to about 10.9 V. The monitoring unit 104 detects a corresponding variation in the sensed input voltage(s) (e.g., $V_1$, $V_2$ . . . and/or, $V_m$), and disregards current readings until the sensed input voltage settles to a base line value or a period of time (e.g., predetermined amount of time) passes. Further, the tractor electrical system may, at times, communicate with an external device EXT (e.g., the Anti-lock brake system) by modulating an input voltage to the external device EXT with a varying signal (e.g., a switching analog signal), which may appear as a series of "chirps." This method of communication may be referred to as power line carrier communication. The monitoring unit 104 may identify the chirps at one or more sensed input voltage and disregard current readings until chirps are no longer detected. The monitoring unit 104 may further take into account the voltage drop across the length of an electrical harness coupled between the status monitoring device 100 and the trailer 120, and any power line carrier communication that is commonly used in trailers, flatbeds, chassis, etc.

In some embodiments, the monitoring unit 104 may be preprogrammed with one or more threshold voltages corresponding to each of the monitored external devices EXT. The one or more threshold voltages may be substantially the same or different as may be suitable depending on the operational characteristics of the external devices EXT being monitored.

In some embodiments, the sensing circuitry of each of the sensors 200 may be substantially the same. However, embodiments of the present invention are not limited thereto, and there may be suitable variations in the internal circuitry of each of the sensors 200 depending on the operational parameters of corresponding external devices EXT.

Figure 3:
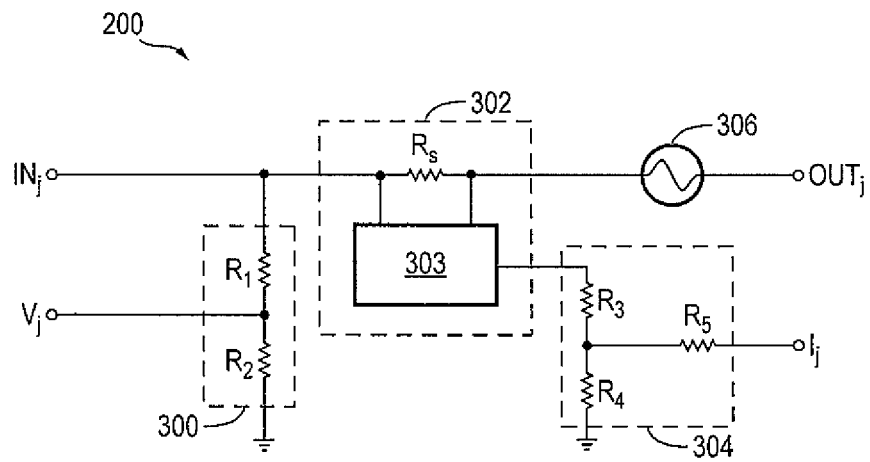
FIG. 3 illustrates a circuit diagram of a sensor, according to some example embodiments of the present invention.

FIG. 3 illustrates a circuit diagram of a sensor 200, according to some example embodiments of the present invention.

In some embodiments, the sensor 200 employs a voltage divider 300 (as represented by series-connected resistors R1 and R2, in FIG. 3) to sense an input voltage to an external device. When powering an external device, the tractor 110 may provide a voltage of, for example, about 8 V to about 16 V, which may or may not comply with input specifications of the monitoring unit 104. Through a proper selection of R1 and R2, the voltage divider 300 attenuates the tractor voltage to a level suitable for measurement by the monitoring unit 104 (as represented by $V_j$).

In some embodiments, the sensor 200 further includes a current sensor 302 for measuring an input current to the external device. The current sensor 302 may employ a differential amplifier 303 (or a similar suitable circuit) to measure a voltage drop across a sense resistor $R_S$ as the input current travels from the electrical system of the tractor 110 to an external device at the trailer 120. The output of the differential amplifier 303 may be attenuated to a suitable level (as represented by the signal $I_j$) by the voltage divider 304 (and through a suitable selection of resistors R3, R4, and R5).

While the embodiments of the present invention illustrated in FIG. 3 employ a sense resistor $R_S$ to measure current, embodiments of the present invention are not limited thereto. For example, in other embodiments of the present invention, the current sensor 302 may include a non-contact sensor, such as a hall-effect current sensor, or any other suitable circuit known to a person of ordinary skill in the art, to produce an output (e.g., output voltage) that is proportional to the input current.

FIG. 3 illustrates embodiments in which the voltage divider 300 is coupled between the tractor 110 and the current sensor 302 and measures the input voltage at a tractor side of the sense resistor $R_S$; however, as will be understood by a person of ordinary skill in the art, the voltage divider 300 may instead be coupled between the current sensor 302 and the trailer 120, and measure the input voltage at a trailer side of the sense resistor $R_S$.

The sensor 200 may further include a fuse (e.g., a resettable fuse) 306 to shut off current to, and thus protect, the external device in the event of an overcurrent condition (e.g., when the input current exceeds an overcurrent threshold, as may occur in the event of an electrical short). In some examples, the fuse may be any suitable polymeric positive temperature coefficient device, which reaches a high resistance under fault conditions (e.g., overcurrent conditions) and cycles back to a conductive state after the current is removed.

Figure 4:
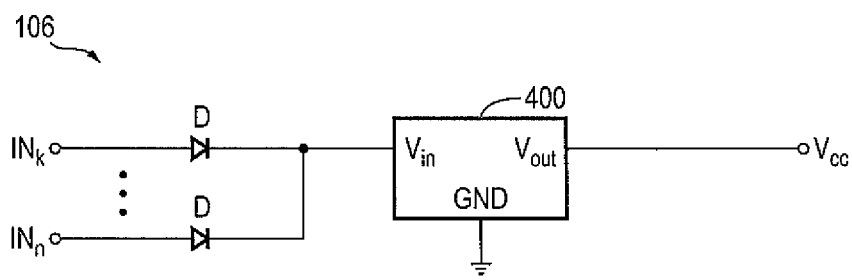
FIG. 4 is a circuit diagram of a power unit, according to some embodiments of the present invention.

FIG. 4 is a circuit diagram of a power unit 106, according to some embodiments of the present invention.

In some embodiments, the power unit 106 draws electrical power from one or more conductors (e.g., through inputs $IN_k$ to $IN_n$ and diodes D) and down-converts the input voltage at a conductor to a regulated voltage $V_{CC}$ suitable for powering the monitoring unit 104. For example, the regulator 400 may down convert an input voltage ranging from about 8 V to about 16 V to a regulated voltage $V_{CC}$ of about 5 V. The regulator 400 may be any suitable linear regulator, switching regulator, or the like.

In some embodiments, the regulator 400 may draw electrical power from the blue conductor, which is often used to power any auxiliary devices at the trailer 120. The regulator may also draw power from a brown conductor, which is often used to power the marker lights of a trailer 120.

In embodiments in which the regulator 400 is coupled to and draws power from more than one conductor (e.g., as shown in FIG. 4), the diodes D that are coupled between the conductors and the regulator 400 ensure that only a conductor having the highest voltage is used as a voltage source to the regulator 400.

Figure 5:
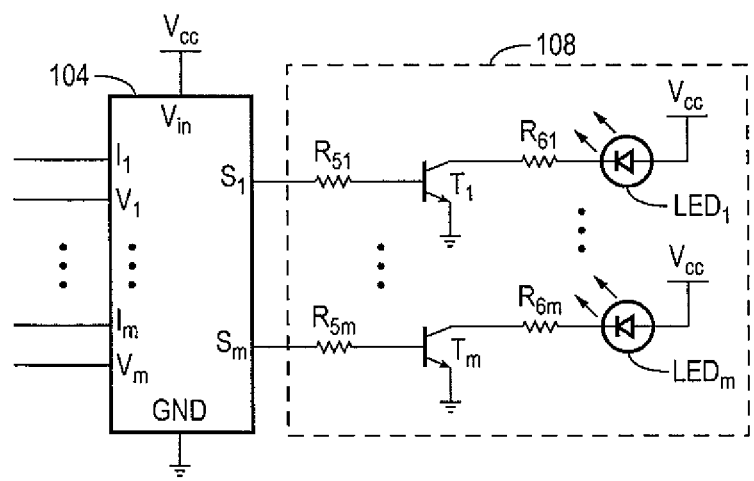
FIG. 5 illustrates a circuit diagram of a status indicator, according to some example embodiments of the present invention.

FIG. 5 illustrates a circuit diagram of a status indicator 108, according to some example embodiments of the present invention.

In some embodiments, the status indicator 108 includes one or more indicator lights (e.g., light emitting diodes such as $LED_1$ to $LED_m$) that turn ON, blink, or change color when the monitoring unit 104 detects a fault in one or more monitored external devices. In some embodiments, when a fault (e.g., an under current condition) is detected in an external device, the monitoring unit 104 generates a signal (e.g., a gate drive signal) to toggle a switch (e.g., one of transistors $T_1$ to $T_m$), which activates (e.g., turns ON) a corresponding one of the indicator lights (e.g., one of $LED_1$ to $LED_m$). Some embodiments of the present invention may use a single LED configured to flash when an error is detected in any of monitored external devices.

The monitoring unit 104 may be configured to generate output signals that produce fault indicators (e.g., visual codes) at the status indicator 108 that may distinguish different types of issues detected by the status monitoring device 100. For example, a first method of indication, such as a slow flash, can indicate that an intermittent occurrence of electrical discontinuity of an external device has been detected. A second method of indication, such as a rapid flash or a solid indictor, can indicate that the electrical wires of the external device are detected to be completely disconnected.

In some embodiments, the status indicator 108 may include a multi-color indicator or a display panel (e.g., a heads-up display) that provides visual or audible cues to the operator (e.g., vehicle driver) indicating that an external device has failed. Upon noticing the cue, the operator of the vehicle may choose to not use the trailer 120, which may thereafter be inspected or repaired.

The status indicator 108 may be mounted roadside on the vehicle (e.g., mounted near one or more of the rearview mirrors of the vehicle) such that the operator can get a glance of the status indicator 108 while driving, or be placed in the interior of the tractor cabin (e.g., on the vehicle dashboard) for easy viewing by the operator.

Additional embodiments of the present invention may use a button or switch to activate and deactivate the status monitoring device 100 (e.g., the status indicator 108). In such embodiments, the operator of the vehicle may activate the button or switch during a standard pre-trip or post-trip inspection to determine if the device has detected an issue with the lighting on the vehicle. The operator may also activate the button or switch while the vehicle in operation (e.g., while the vehicle is moving) to detect any faults that may occur during the operation of the vehicle in real time.

Figure 6:
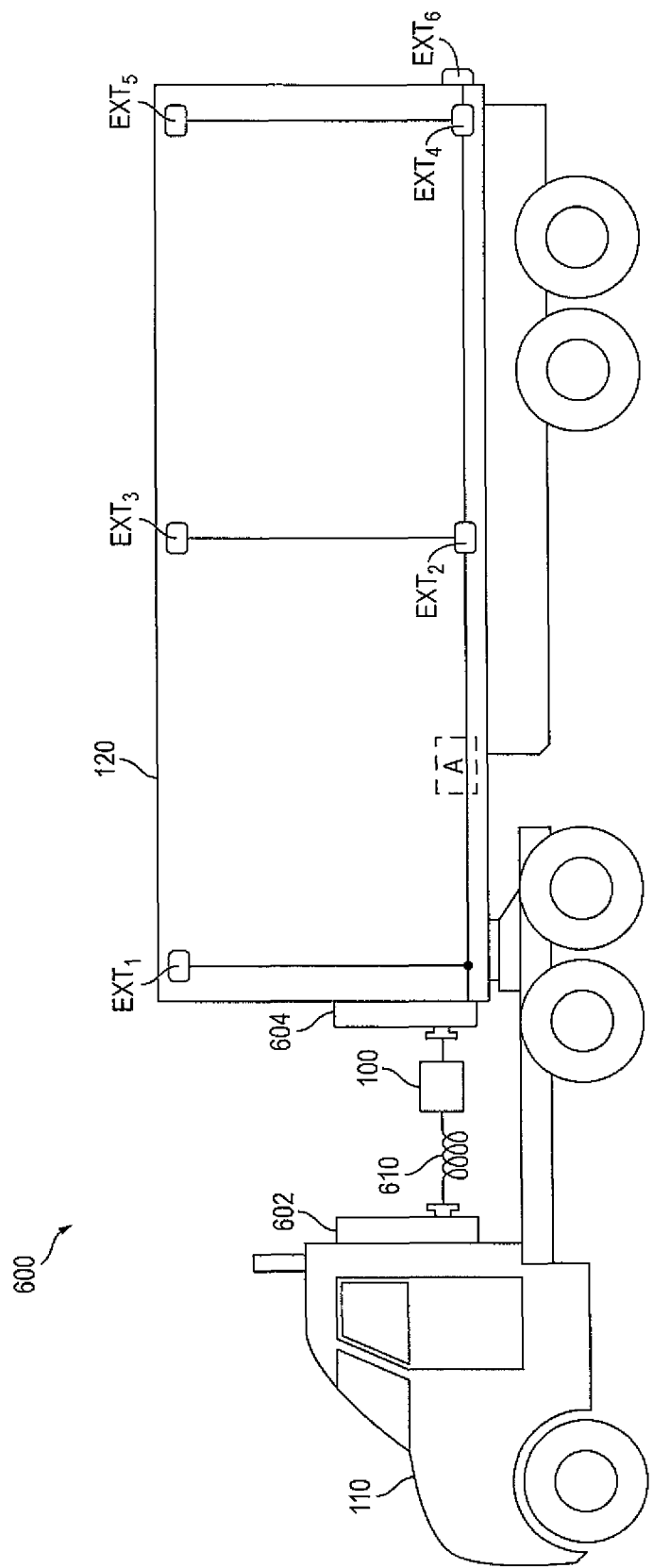
FIG. 6 is a schematic representation of a status monitoring device used in vehicle to couple the electrical systems of the tractor and the trailer, according to some embodiments of the present invention.

FIG. 6 is a schematic representation of a status monitoring device 100 used in vehicle 600 to couple the electrical systems of the tractor 110 and the trailer 120, according to some embodiments of the present invention.

Generally, the vehicle 600 may include a first junction box 602 and a second junction box 604, which are points of entry or egress of electrical connections to or out of the tractor 110 and trailer 120, respectively. The vehicle 600 may further include an electrical harness 610 for coupling (e.g., electrically connecting) the first and second junction boxes 602 and 604.

In some embodiments, the status monitoring device 100 is coupled in series with the harness 610, and may be coupled between the harness 610 and the first junction box 602 or be coupled between the harness 610 and the second junction box 604. In some embodiments, the status monitoring device 100 may be integrated with (e.g., built into) any one of the first junction box 602, the second junction box 604, or the harness 610.

However, embodiments of the present invention are not limited thereto, and in some embodiments the status monitoring device 100 may be located between external devices EXT of the trailer electrical system (e.g., in position A shown in FIG. 6). In such embodiments, the status monitoring device 100 may only be capable of monitoring the status of external devices EXT that are downstream from the device 100 (such as $EXT_2$ to $EXT_6$), and any external device (e.g., $EXT_1$) upstream from the device 100 (i.e., coupled between the tractor 110 and the status monitoring device 100) may be unaccounted for.

Figure 7A:
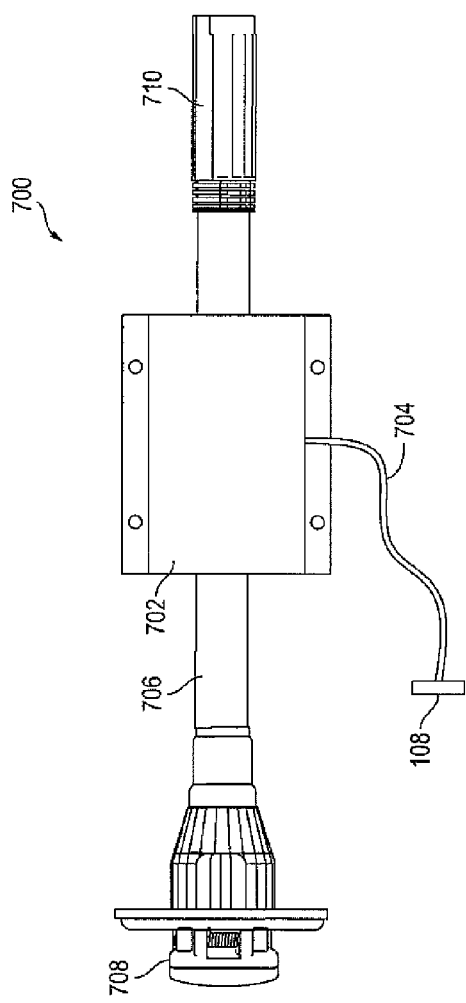
FIGS. 7A and 7B are top and perspective views, respectively, of a status monitoring connector including the status monitoring device, according to some embodiments of the present invention.
Figure 7B:
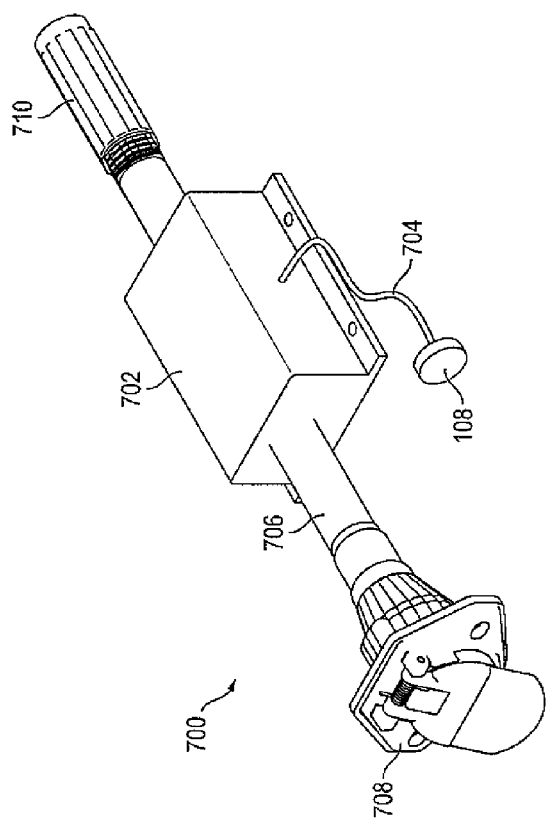

FIGS. 7A and 7B are top and perspective views, respectively, of the status monitoring connector 700 including the status monitoring device 100, according to some embodiments of the present invention.

In some embodiments, the status monitoring connector 700 includes a box 702 for accommodating (e.g., housing) the constituent components of the status monitoring device 100, such as, the sensing unit 102, the monitoring unit 104, and the power unit 106. The status indicator 108 may be external to the box 702 and be coupled to it through wiring 704. The status monitoring connector 700 may further include a cable 706 for coupling to the electrical systems of the tractor 110 and the trailer 120.

In some embodiments of the present invention, the device may include a first and second plug-ends 708 and 710, which are integrated therein, to be mated to corresponding plugs and sockets that are part of the electrical systems of the tractor 110 and trailer 120 (e.g., part of the first and second junction boxes 602 and 604 of FIG. 6). In some embodiments, the first plug-end 708 is a female connector and the second plug-end 710 is male connector, which is configured to physically and electrically mate with the female connector of the first plug-end 708. In other embodiments, the first and second plug-ends are designed not be compatible with one another (e.g., not capable of mating with one another).

Although a female plug-end 708 is depicted as being the electrical connection at one end of the status monitoring connector 700 in FIGS. 7A and 7B, the present invention is not limited thereto, and other methods of electrical connection may extend from the device. For example, the connector 700 may include, or may be coupled to, ring terminals at each end of the connector 700, wherein the ring terminals are each designated to be coupled to a different wire harness (e.g., one wire harness going to the various electrical systems of the trailer 120 and one wire harness going to the electrical generator of the truck).

In some embodiments, the status monitoring connector 700 is configured to be compatible with a multi-conductor electrical system (at the tractor 110 and trailer 120) having, for example, 4, 5, 7, 12, and 15, etc. conductors, and monitors the external devices corresponding to (e.g., coupled to) one or more of the conductors (e.g., the red, black, brown, green and yellow conductors). In other embodiments, the status monitoring connector 700 may be compatible with plug-and-socket arrangements including a different number of conductors (e.g., plug-and-sockets that correspond to systems having 4 or 6 electrical conductors and corresponding external devices).

Accordingly, embodiments of the present invention provide a device configured to detect electrical issues of various circuits of a vehicle-trailer connection, and is configured to alert the operator of the vehicle of the detected electrical issues in real time.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of operation can be practiced without meaningfully departing from the principles, spirit, and scope of this invention, as set forth in the following claims and equivalents thereof.

The terms used in the present specification are used to describe particular embodiments, and are not intended to limit the present invention. For example, it will be understood that, although the terms "first," "second," etc. may be used herein to describe various elements, these elements would not be limited by the strict construction of these terms. Instead, these terms are used only to distinguish one component from another. Further, an expression used in the singular encompasses the expression of the plural, unless it has a clearly different meaning in the context. In the present specification, it is to be understood that the terms such as "comprising," "including," "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when an element or layer is referred to as being "on," "connected to," or "coupled to" another element or layer, it can be directly on, connected to, or coupled to the other element or layer, or one or more intervening elements or layers may also be present. Similarly, when an element or layer is referred to as being "connected at" or "coupled at" another element or layer, the element or layer may be directly or indirectly "connected at" or "coupled at" said another element or layer. When an element is referred to as being "directly on," "directly connected to," "directly coupled to," "directly connected at," or "directly coupled at" another element or layer, there are no intervening elements or layers present. Like numbers refer to like elements throughout. As used herein, the term "and/or" includes any and all combinations of one or more of the associated listed items. When the phrase "at least one of" is applied to a list, it is being applied to the entire list, and not to the individual members of the list.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Further, when describing embodiments of the present invention, the use of "may" relates to "one or more embodiments of the present invention."

As used herein, the term "substantially," "about," and similar terms are used as terms of approximation and not as terms of degree, and are intended to account for the inherent deviations in measured or calculated values that would be recognized by those of ordinary skill in the art. Also, the terms "use," "using," and "used" may be considered synonymous with the terms "utilize," "utilizing," and "utilized," respectively.

What is claimed is:

1. A status monitoring circuit for monitoring the status of an external device coupled to an electrical system of a vehicle, the status monitoring circuit comprising:
   a sensing unit coupled to the external device and configured to sense an input voltage and an input current at the external device;
   a monitoring unit coupled to the sensing unit and configured to determine whether the external device is operational based on the sensed input voltage, and, in response, to detect an undercurrent condition of the external device based on the sensed input current, the monitoring unit being further configured to disregard the sensed input current when the external device is not operational; and
   a status indicator coupled to the monitoring unit and configured to display a fault indication in response to the monitoring unit detecting the undercurrent condition.

2. The status monitoring circuit of claim 1, wherein the monitoring unit is further configured to determine the external device is operational when the sensed input voltage exceeds a voltage threshold.

3. The status monitoring circuit of claim 1, wherein the monitoring unit is further configured to detect the undercurrent condition of the external device when the sensed input current is less than a current threshold.

4. The status monitoring circuit of claim 1, wherein the sensing unit comprises a resettable fuse configured to shut off current to the external device when the sensed input current exceeds an overcurrent threshold.

5. The status monitoring circuit of claim 4, wherein the resettable fuse comprises a polymeric positive temperature coefficient device.

6. The status monitoring circuit of claim 1, wherein the sensing unit comprises:
   a voltage divider configured to generate an attenuated input voltage proportional to the input voltage and to transmit the attenuated input voltage to monitoring unit.

7. The status monitoring circuit of claim 6, wherein the monitoring unit is further configured to determine the external device is operational when the attenuated input voltage exceeds a voltage threshold.

8. The status monitoring circuit of claim 7, wherein the voltage threshold is substantially zero.

9. The status monitoring circuit of claim 1, wherein the sensing unit comprises:
   a sense resistor in line with the input current;
   a differential amplifier for generating an output voltage proportional to the input current traversing the sense resistor; and
   a voltage divider for attenuating the output voltage and to transmit, to the monitoring unit, a signal indicative of the input current.

10. The status monitoring circuit of claim 9, wherein the monitoring unit is further configured to detect the undercurrent condition of the external device when the transmitted signal is less than a current threshold.

11. The status monitoring circuit of claim 1, wherein the sensing unit comprises a non-contact type current sensor.

12. The status monitoring circuit of claim 1, further comprising a power unit configured to supply a regulated voltage to the monitoring unit and the status indicator,
   wherein the power unit regulates the input voltage at the external device to generate the regulated voltage.

13. The status monitoring circuit of claim 12, wherein the power unit comprises a linear regulator or a switching regulator.

14. The status monitoring circuit of claim 1, wherein the monitoring unit comprises a programmable microcontroller configured not to detect the undercurrent condition when the vehicle is in engine start mode.

15. The status monitoring circuit of claim 1, wherein the status indicator comprises:
   an indicator light; and
   a switch configured to turn ON the indicator light in response to the monitoring unit detecting the undercurrent condition.

16. The status monitoring circuit of claim 1, wherein the monitoring unit is further configured to disregard the sensed input current until the sensed input voltage settles to a value or a period of time passes.

17. A status monitoring connector configured to be coupled to an electrical system of a tractor and an electrical system of trailer comprising an external device, the status monitoring connector comprising:
- a sensing unit coupled to the external device and configured to sense an input voltage and an input current at the external device;
- a monitoring unit coupled to the sensing unit and configured to determine a normal operation of the external device based on the sensed voltage, and, in response, to detect an undercurrent condition of the external device based on the sensed input current;
- a status indicator coupled to the monitoring unit and configured to display a fault indication in response to the monitoring unit detecting the undercurrent condition;
- a housing configured to accommodate the sensing unit and the monitoring unit;
- a first end coupled to the housing and configured to couple to the electrical system of the tractor; and
- a second end coupled to the housing and configured to couple to the electrical system of the trailer.

18. The status monitoring connector of claim 17, wherein the first and second ends are compatible with a multi-conductor plug and socket arrangements of the electrical systems of the tractor and the trailer.

19. The status monitoring connector of claim 17, wherein the first end comprises a female connector and the second end comprises a male connector, the female and male connectors being configured to physically mate and electrically couple to one another.

20. The status monitoring connector of claim 17, wherein the first end and the second end are configured not to physically mate with one another.

* * * * *